United States Patent
Wolak et al.

(10) Patent No.: US 9,341,856 B2
(45) Date of Patent: May 17, 2016

(54) HIGH BRIGHTNESS DIODE OUTPUT METHODS AND DEVICES

(71) Applicant: II-VI Laser Enterprise GmbH, Zurich (CH)

(72) Inventors: Edmund L. Wolak, Lake Osawego, OR (US); Oscar D. Romero, Jr., Tucson, AZ (US); James Harrison, Oro Valley, AZ (US); Sang-Ki Park, Tucson, AZ (US)

(73) Assignee: II-VI LASER ENTERPRISE GMBH, Zürich (CH)

( * ) Notice: Subject to any disclaimer, the term of this patent is extended or adjusted under 35 U.S.C. 154(b) by 0 days.

(21) Appl. No.: 14/312,649

(22) Filed: Jun. 23, 2014

(65) Prior Publication Data

US 2014/0300971 A1 Oct. 9, 2014

Related U.S. Application Data

(62) Division of application No. 12/990,215, filed as application No. PCT/US2009/043182 on May 7, 2009, now Pat. No. 8,804,246.

(60) Provisional application No. 61/051,628, filed on May 8, 2008.

(51) Int. Cl.
*G02B 3/00* (2006.01)
*G02B 27/30* (2006.01)
(Continued)

(52) U.S. Cl.
CPC ............ *G02B 27/30* (2013.01); *G02B 19/0014* (2013.01); *G02B 19/0028* (2013.01); *G02B 19/0057* (2013.01); *G02B 27/0905* (2013.01);
(Continued)

(58) Field of Classification Search
CPC ............... G02B 27/09; G02B 27/0905; G02B 27/0916; G02B 27/0922; G02B 27/0938; G02B 27/095; G02B 27/0955; G02B 27/0961; G02B 27/0966; G02B 27/0972; G02B 19/00; G02B 19/0004; G02B 19/0009; G02B 19/0033; G02B 19/0047; G02B 19/0052; G02B 19/0057
See application file for complete search history.

(56) References Cited

U.S. PATENT DOCUMENTS

| | | | |
|---|---|---|---|
| 4,428,647 | A | 1/1984 | Sprague |
| 4,535,773 | A | 8/1985 | Yoon |

(Continued)

FOREIGN PATENT DOCUMENTS

| | | |
|---|---|---|
| CN | 1611969 | 5/2005 |
| DE | 10 2004 00693 | 10/2005 |

(Continued)

OTHER PUBLICATIONS

Andersen et al., "High Repetition Rate Tunable Femtosecond Pulses from Fiber Laser Pumped Parametric Amplifier," Advanced Solid-State Photonics, ME2, Abstract of Talk 4:30pm Jan. 30, 2006.

(Continued)

*Primary Examiner* — Scott J Sugarman
*Assistant Examiner* — Robert E Tallman
(74) *Attorney, Agent, or Firm* — Anderson IP, Inc.

(57) ABSTRACT

Devices and methods for maintaining the brightness of laser emitter bar outputs having multiple emitters for coupling and other applications. In some embodiments, at least one brightness enhancement optic may be used in combination with a beam reformatting optic.

7 Claims, 12 Drawing Sheets

(51) Int. Cl.
*G02B 27/09* (2006.01)
*G02B 19/00* (2006.01)
*H01S 5/40* (2006.01)

(52) U.S. Cl.
CPC ........ *G02B 27/0961* (2013.01); *G02B 27/0966* (2013.01); *H01S 5/4025* (2013.01); *H01S 5/4012* (2013.01)

(56) References Cited

U.S. PATENT DOCUMENTS

| | | | |
|---|---|---|---|
| 4,763,975 A | 8/1988 | Scifres | |
| 4,910,539 A | 3/1990 | Mathis et al. | |
| 5,049,981 A | 9/1991 | Dahringer | |
| 5,127,068 A | 6/1992 | Baer | |
| 5,144,486 A | 9/1992 | Hart | |
| 5,168,401 A | 12/1992 | Endriz | |
| 5,230,969 A | 7/1993 | Savant et al. | |
| 5,243,619 A | 9/1993 | Albers et al. | |
| 5,334,150 A | 8/1994 | Kaali | |
| 5,365,366 A | 11/1994 | Kafka et al. | |
| 5,367,529 A | 11/1994 | Holsinger et al. | |
| 5,381,859 A | 1/1995 | Minakami et al. | |
| 5,446,749 A | 8/1995 | Nighan et al. | |
| 5,513,201 A | 4/1996 | Yamaguchi | |
| 5,562,696 A | 10/1996 | Nobles et al. | |
| 5,579,422 A | 11/1996 | Head et al. | |
| 5,691,989 A | 11/1997 | Rakuljic et al. | |
| 5,740,288 A | 4/1998 | Pan | |
| 5,740,292 A | 4/1998 | Strasser | |
| 5,787,107 A | 7/1998 | Leger | |
| 5,808,323 A | 9/1998 | Spaeth | |
| 5,825,551 A | 10/1998 | Clarkson | |
| 5,832,150 A | 11/1998 | Flint | |
| 5,848,083 A | 12/1998 | Haden et al. | |
| 5,986,794 A | 11/1999 | Krause | |
| 5,993,073 A | 11/1999 | Hamakawa et al. | |
| 5,999,544 A | 12/1999 | Petersen | |
| 6,044,096 A | 3/2000 | Wolak et al. | |
| 6,064,515 A | 5/2000 | Yang | |
| 6,084,895 A | 7/2000 | Kouchi et al. | |
| 6,107,113 A | 8/2000 | Harmand et al. | |
| 6,160,664 A | 12/2000 | Du et al. | |
| 6,175,452 B1 | 1/2001 | Ullmann et al. | |
| 6,185,235 B1 | 2/2001 | Cheng et al. | |
| 6,215,598 B1 | 4/2001 | Hwu | |
| 6,314,116 B1 | 11/2001 | Wright et al. | |
| 6,324,326 B1 | 11/2001 | Dejneka et al. | |
| 6,331,692 B1 | 12/2001 | Krause et al. | |
| 6,335,822 B1 | 1/2002 | Toyohara | |
| 6,337,873 B1 | 1/2002 | Goering et al. | |
| 6,356,380 B1 | 3/2002 | Whitney | |
| 6,356,577 B1 | 3/2002 | Miller | |
| 6,384,896 B1 | 5/2002 | Tatsuduki | |
| 6,389,198 B2 | 5/2002 | Kafka et al. | |
| 6,396,857 B1 | 5/2002 | Labranche et al. | |
| 6,428,217 B1 | 8/2002 | Giltner | |
| 6,448,801 B2 | 9/2002 | Dischiano | |
| 6,493,148 B1 | 12/2002 | Anikitchev | |
| 6,504,858 B2 | 1/2003 | Cheng et al. | |
| 6,516,011 B1 | 2/2003 | Treusch | |
| 6,559,879 B1 | 5/2003 | Kobayashi et al. | |
| 6,594,092 B2 | 7/2003 | von Freyhold et al. | |
| 6,600,605 B1 | 7/2003 | Anikitchev | |
| 6,643,302 B1 | 11/2003 | Nishikawa et al. | |
| 6,736,554 B2 | 5/2004 | Kerboeuf et al. | |
| 6,768,593 B1 | 7/2004 | Jutamulia | |
| 6,771,686 B1 | 8/2004 | Ullman et al. | |
| 6,778,732 B1 | 8/2004 | Fermann | |
| 6,804,277 B2 | 10/2004 | Kimura et al. | |
| 6,822,978 B2 | 11/2004 | Kafka et al. | |
| 6,831,778 B2 | 12/2004 | Yang et al. | |
| 6,876,784 B2 | 4/2005 | Nikolov et al. | |
| 6,882,664 B2 | 4/2005 | Bolshtyansky et al. | |
| 6,888,679 B2 | 5/2005 | Brown | |
| 6,891,876 B2 | 5/2005 | Sutter et al. | |
| 6,897,486 B2 | 5/2005 | Loh | |
| 6,898,231 B2 | 5/2005 | Butterworth | |
| 6,919,990 B2 | 7/2005 | Anikitchev et al. | |
| 6,922,288 B2 | 7/2005 | Yamanaka et al. | |
| 6,922,419 B1 | 7/2005 | Nighan et al. | |
| 6,931,037 B2 | 8/2005 | Nighan et al. | |
| 6,969,206 B2 | 11/2005 | Iwanaga et al. | |
| 6,977,769 B2 | 12/2005 | Matsushita et al. | |
| 6,985,648 B2 | 1/2006 | Kish et al. | |
| 6,993,059 B2 | 1/2006 | Anikitchev et al. | |
| 7,006,194 B2 | 2/2006 | Sumiyoshi et al. | |
| 7,006,549 B2 | 2/2006 | Anikitchev et al. | |
| 7,010,194 B2 | 3/2006 | Anikitchev et al. | |
| 7,027,228 B2 | 4/2006 | Mikhailov | |
| 7,065,105 B2 | 6/2006 | Ehlers et al. | |
| 7,244,965 B2 | 7/2007 | Andrews et al. | |
| 7,259,907 B2 | 8/2007 | Langhans | |
| 7,322,754 B2 | 1/2008 | Wolf et al. | |
| 7,372,879 B2 | 5/2008 | Giaretta et al. | |
| 7,379,237 B1 | 5/2008 | Di Teodoro et al. | |
| 7,830,608 B2 | 11/2010 | Hu et al. | |
| 7,866,897 B2 | 1/2011 | Hu et al. | |
| 8,644,357 B2 | 2/2014 | Liu et al. | |
| 2002/0030200 A1 | 3/2002 | Yamaguchi et al. | |
| 2002/0037142 A1 | 3/2002 | Rossi | |
| 2002/0172475 A1 | 11/2002 | Miyazaki et al. | |
| 2003/0044132 A1 | 3/2003 | Nasu et al. | |
| 2003/0048987 A1 | 3/2003 | Saito et al. | |
| 2003/0161357 A1 | 8/2003 | Bolshtyansky et al. | |
| 2004/0095983 A1 | 5/2004 | Whitley | |
| 2004/0114860 A1 | 6/2004 | Dultz et al. | |
| 2004/0151431 A1 | 8/2004 | Ukrainczyk | |
| 2004/0184753 A1 | 9/2004 | Teramura et al. | |
| 2004/0213305 A1 | 10/2004 | Nakae et al. | |
| 2004/0252743 A1 | 12/2004 | Anikitchev et al. | |
| 2004/0252744 A1 | 12/2004 | Anikitchev et al. | |
| 2004/0258117 A1 | 12/2004 | Nebel et al. | |
| 2005/0018743 A1 | 1/2005 | Volodin et al. | |
| 2005/0069255 A1 | 3/2005 | Nishimura et al. | |
| 2005/0105189 A1 | 5/2005 | Mikhailov | |
| 2005/0207454 A1 | 9/2005 | Starodoumov et al. | |
| 2005/0248819 A1 | 11/2005 | Hymel et al. | |
| 2005/0248820 A1 | 11/2005 | Moser et al. | |
| 2005/0257917 A1 | 11/2005 | East et al. | |
| 2006/0018609 A1 | 1/2006 | Sonoda et al. | |
| 2006/0039418 A1 | 2/2006 | Anikitchev et al. | |
| 2006/0045143 A1 | 3/2006 | Anikitchev et al. | |
| 2006/0103939 A1* | 5/2006 | Zheng et al. | 359/619 |
| 2006/0114955 A1 | 6/2006 | Steckman | |
| 2006/0126690 A1 | 6/2006 | Kido et al. | |
| 2006/0147158 A1 | 7/2006 | Sato et al. | |
| 2006/0176912 A1 | 8/2006 | Anikitchev | |
| 2006/0263004 A1* | 11/2006 | Klimek et al. | 385/18 |
| 2006/0274797 A1 | 12/2006 | Myers et al. | |
| 2006/0280209 A1 | 12/2006 | Treusch et al. | |
| 2006/0291509 A1 | 12/2006 | Mitra et al. | |
| 2007/0024959 A1 | 2/2007 | Peterson | |
| 2007/0075465 A1 | 4/2007 | Taylor et al. | |
| 2007/0223862 A1 | 9/2007 | Thyzel | |
| 2007/0263684 A1 | 11/2007 | Nolan | |
| 2007/0268571 A1* | 11/2007 | Hu et al. | 359/349 |
| 2007/0268572 A1 | 11/2007 | Hu et al. | |
| 2007/0291373 A1 | 12/2007 | Hu et al. | |
| 2007/0291813 A1 | 12/2007 | Hu et al. | |
| 2008/0008216 A1 | 1/2008 | Miller et al. | |
| 2008/0008217 A1 | 1/2008 | Miller et al. | |
| 2008/0101429 A1 | 5/2008 | Sipes | |
| 2009/0104727 A1 | 4/2009 | Krejci et al. | |
| 2009/0115833 A1 | 5/2009 | Soulliaert et al. | |
| 2009/0251697 A1 | 10/2009 | Cutillas et al. | |
| 2009/0323175 A1 | 12/2009 | Mukai et al. | |
| 2010/0177796 A1 | 7/2010 | Miller | |
| 2011/0051758 A1 | 3/2011 | Krejci et al. | |
| 2012/0177074 A1 | 7/2012 | Liu et al. | |

(56) References Cited

U.S. PATENT DOCUMENTS

FOREIGN PATENT DOCUMENTS

| | | |
|---|---|---|
| EP | 1 298 460 | 4/2003 |
| JP | 03-131835 | 6/1991 |
| JP | 05-004112 | 1/1993 |
| JP | 09-159880 | 6/1997 |
| JP | 2001-343561 | 12/1997 |
| JP | 411233857 | 8/1999 |
| JP | 2001-83369 | 3/2001 |
| JP | 2002-148491 | 5/2002 |
| JP | 2002/148562 | 5/2002 |
| JP | 2003-131083 | 5/2003 |
| JP | 2003-198051 | 7/2003 |
| JP | 2004-022679 | 1/2004 |
| JP | 2004/070072 | 3/2004 |
| JP | 2004-096009 | 3/2004 |
| JP | 2004/096092 | 3/2004 |
| JP | 2005-134916 | 5/2005 |
| JP | 2005-167041 | 6/2005 |
| JP | 2006-032352 | 2/2006 |
| JP | 2006-171348 | 6/2006 |
| JP | 2006-337594 | 12/2006 |
| JP | 2007-149932 | 6/2007 |
| JP | 2007-528509 | 10/2007 |
| JP | 2007-298933 | 11/2007 |
| JP | 2007-300015 | 11/2007 |
| JP | 2009-503596 | 1/2009 |
| JP | 2010-175579 | 8/2010 |
| JP | 2011-520292 | 7/2011 |
| WO | WO 99/49343 | 3/1999 |
| WO | WO 02/077698 | 10/2002 |
| WO | WO 2005/085935 | 9/2005 |
| WO | WO 2007/137005 | 11/2007 |
| WO | WO 2009/037555 | 3/2009 |
| WO | WO 2009/079567 | 7/2009 |
| WO | WO 2009/137703 | 11/2009 |
| WO | WO 2010/081092 | 7/2010 |
| WO | WO 2010/118290 | 10/2010 |
| WO | WO 2011/091170 | 7/2011 |

OTHER PUBLICATIONS

Becht, Vector phase conjuguation for beam combining in a pulsed Nd:YAG laser system, Proceedings of the SPIE—The International Society for Optical Engineering, 3263:11-19 (1998).
Brunner et al., "Powerful red-green-blue laser source pumped with a mode-locked thin disk laser," Optics Letters 29(16):1921-1923, Aug. 15, 2004.
Fuhr, Polarization power summing in laser diode communication systems, SPIE 740:70-76 (1987).
Ghislotti et al., Bidirectional Pumping of Er-Doped Fibers Using Detuned 980-nm Lasers, IEEE Photonics Technology Letters 14(5):780-782 2002.
Headley et al., Tapered Fiber bundles for combining laser pumps., Proceedings of the SPIE—The International Society for Optical Engineering, 5709(1):263-272 (2005).
Knitsch et al., Diode Laser Modules of Highest Brilliance for Materials Processing, Proceedings of the SPIE, vol. 4651:256-263 (2002).
Kruglov et al., "Self-similar propagation of parabolic pulses in normal-dispersion fiber amplifiers," JOSA B, 19(3):461-469 2002.
Mecherle, Laser diode combining for free space optical communication, Proceedings of the SPIE—The International Society for Optical Engineering, 616:281-291 (1986).
Miyajima et al., Single Wavelength 5.6 Direct Diode Laser with a High-Efficiency Beam Combination, Jpn. J. Appl. Phys., 43(8):5269-5272 (2004).
Moser et al., "Volume Bragg Grating Devices," Friday Morning Optical Fiber Communications Conference, 2003, OFC 2003 pp. 644-645, vol. 2, Mar. 28, 2003.
Ondax, Inc., "Volume Holographic Gratings (VHG)," 2005 pp. 1-7.
Piper et al., 1.2 mJ, 37 ns single-moded pulses at 10kHz repetition rate from a Q-switched ytterbium fiber Laser, Abstract, in, Proceedings of CLEO/IQEC May 16-21, 2004: Conference on Lasers and Electro-Optics, Quantum Electronics and Laser Science. USA, Institute of Electrical and Electronics Engineers.
Rothenberg, Polarization beam smoothing for ineertial confinement fusion, J. Applied Physics, 87(8):3654-3662 (2000).
Sincerbox, Laser Beam Combining, IBM Technical Disclosure Bulletin, 12(10):1663-1664 (1970).
Steinmann et al., "Tunable fs Laser Pulses from OPA with MHz Repetition Rate," Advanced Solid-State Photonics, TuC6, Abstract of Talk, 12:30pm Jan. 31, 2006.
Thestrup et al, High brightness laser source based on polarization coupling of two diode lasers with asymmetric feedback, Applied Physics Letters, 82(5):680-682 (2003).
Tra Fiberoptics, Inc. High-Powered SMA Connectors for Photonic Crystal Fiber. TraTech Fiberoptic, Inc. Brochure; 2004.
Treusch et al., High-Brightness Semiconductor Laser Sources for Materials Processing: Stacking, Beam Shaping, and Bars, IEEE Journal of Selected Topics in Quantum Electronics, 6(4):601-614 (2000).
Valdor Fiber Optics Catalog #910-00001, pp. 1-2 Impact Mount Singlemode Laser Pigtails, Printed from the internet: Dec. 22, 2006.
Volodin et al., Wavelength Stabilization and spectrum narrowing of high-power multimode laser diodes and arrays by use of volume Bragg gratings. Optics Letters 29(16): Aug. 15, 2004.
International Search Report and Written Opinion mailed on Nov. 26, 2007 for International Application No. PCT/US2007/069717 filed on: May 10, 2007 and published as: WO/2007/137005 on: Nov. 29, 2007.
International Search Report and Written Opinion mailed on: Jul. 24, 2009 for International Application No. PCT/US2008/087198 filed on: Dec. 17, 2008 and published as: WO/2009/079567 on: Jun. 25, 2009.
International Search Report and Written Opinion mailed on Dec. 28, 2009 for International Application No. PCT/US2009/043182 filed on: May 7, 2009 and published as: WO/2009/137703 on: Nov. 12, 2009.
International Search Report and Written Opinion mailed on Sep. 30, 2011 for International Application No. PCT/US2011/021931 filed on: Jan. 20, 2011 and published as: WO/2011/091170 on: Jul. 28, 2011.
International Search Report and Written Opinion mailed on Mar. 17, 2010 for International Application No. PCT/US2010/020647 filed on: Jan. 11, 2010 and published as: WO/2010/081092 on: Jul. 15, 2010.
International Search Report and Written Opinion mailed on Jun. 7, 2010 for International Application No. PCT/US2010/030486 filed on: Apr. 9, 2010 and published as: WO/2010/118290 on: Oct. 14, 2010.
supplementary European Search Report dated: Jul. 26, 2013 for European Application No. EP09743669, completed Jul. 12, 2013 and published as EP2283549 on Feb. 16, 2011.
Office Action mailed on Jul. 16, 2010 for U.S. Appl. No. 11/747,172, filed May 10, 2007 published as: US 2007/0268571 A1 on Nov. 22, 2007, issued as: U.S. Pat. No. 7,830,608 on Nov. 9, 2010.
Office Action mailed on Dec. 15, 2009 for U.S. Appl. No. 11/747,172, filed May 10, 2007 published as: US 2007/0268571 A1 on Nov. 22, 2007, issued as: U.S. Pat. No. 7,830,608 on Nov. 9, 2010.
Office Action mailed on Jul. 24, 2009 for U.S. Appl. No. 11/747,172, filed May 10, 2007 published as: US 2007/0268571 A1 on Nov. 22, 2007, issued as: U.S. Pat. No. 7,830,608 on Nov. 9, 2010.
Office Action mailed on Jan. 23, 2009 for U.S. Appl. No. 11/747,172, filed May 10, 2007 published as: US 2007/0268571 A1 on Nov. 22, 2007, issued as: U.S. Pat. No. 7,830,608 on Nov. 9, 2010.
Office Action mailed on Jul. 29, 2008 for U.S. Appl. No. 11/747,172, filed May 10, 2007 published as: US 2007/0268571 A1 on Nov. 22, 2007issued as: U.S. Pat. No. 7,830,608 on Nov. 9, 2010.
Office Action mailed on Jul. 8, 2009 for U.S. Appl. No. 11/747,184, filed May 10, 2007 published as: US 2007/0268572 A1 on Nov. 22, 2007.
Office Action mailed on Dec. 10, 2008 for U.S. Appl. No. 11/747,184, filed May 10, 2007 published as: US 2007/0268572 A1 on Nov. 22, 2007.

(56) References Cited

OTHER PUBLICATIONS

Office Action mailed on Nov. 3, 2009 for U.S. Appl. No. 11/761,901, filed Jun. 12, 2007 published as: US 2007/0291813 A1 on Nov. 22, 2007 and Issued as: U.S. Pat. No. 7,680,170 on Mar. 16, 2010.
Office Action mailed on Aug. 24, 2009 for U.S. Appl. No. 11/761,901, filed Jun. 12, 2007 published as: US 2007/0291813 A1 on Nov. 22, 2007 and Issued as: U.S. Pat. No.7,680,170 on Mar. 16, 2010.
Office Action mailed on Jun. 14, 2013 for U.S. Appl. No. 12/337,275, filed Dec. 17, 2008 published as: US 2009/251697 A1 on Oct. 8, 2009.
Office Action mailed on Feb. 22, 2013 for U.S. Appl. No. 12/337,275, filed Dec. 17, 2008 published as: US 2009/251697 A1 on Oct. 8, 2009.
Office Action mailed on Jul. 17, 2012 for U.S. Appl. No. 12/337,275, filed Dec. 17, 2008 published as: US 2009/251697 A1 on Oct. 8, 2009.
Office Action mailed on Dec. 22, 2011 for U.S. Appl. No. 12/337,275, filed Dec. 17, 2008 published as: US 2009/251697 A1 on Oct. 8, 2009.
Office Action mailed on May 11, 2011 for U.S. Appl. No. 12/337,275, filed Dec. 17, 2008 published as: US 2009/251697 A1 on Oct. 8, 2009.
Office Action dated: Mar. 30, 2014 for U.S. Appl. No. 12/990,215, filed Jan. 12, 2011 and published as:2011/0103056 on: May 5, 20111.
Office Action dated: Dec. 24, 2013 for U.S. Appl. No. 12/990,215, filed Jan. 12, 2011 and published as:2011/0103056 on: May 5, 20111.
Office Action dated: May 24, 2013 for U.S. Appl. No. 12/990,215, filed Jan. 12, 2011 and published as:2011/0103056 on: May 5, 20111.
Office Action dated: May 17, 2013 for U.S. Appl. No. 13/004,679, filed Jan. 11, 2011 and published as: 2012/0177074 on: Jul. 12, 2012.
Office Action dated: Sep. 27, 2013 for U.S. Appl. No. 13/004,679, filed Jan. 11, 2011 and published as: 2012/0177074 on: Jul. 12, 2012.
Supplementary European Search Report dated: Mar. 17, 2014 for European Application No. EP08862579 completed Feb. 19, 2014.
Office Action dated: Jul. 17, 2014 for U.S. Appl. No. 13/522,692, filed Nov. 14, 2012 and published as: 2013/0058124 on: Mar. 7, 2013.
extended European Search Report dated: May 12, 2015 in European Patent Application No. EP 11735195.7 filed: Jan. 20, 2011.

* cited by examiner

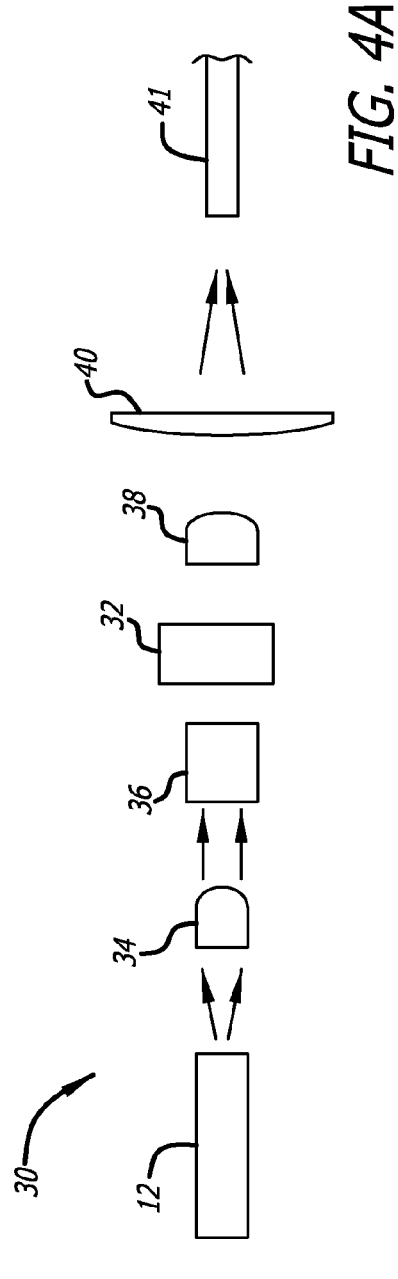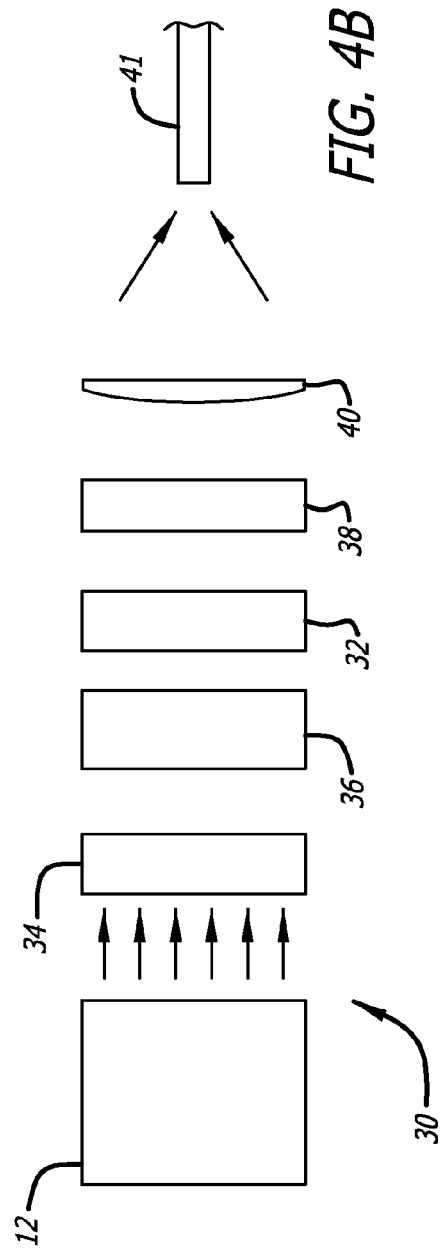

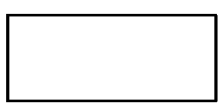
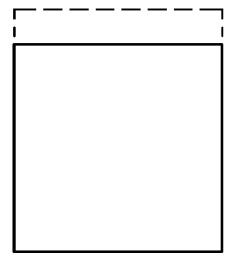
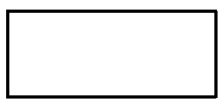
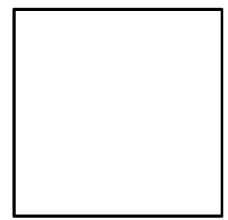
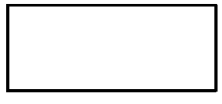
*FIG. 4C*
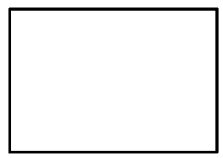
*FIG. 4D*
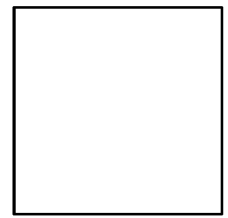
*FIG. 4E*
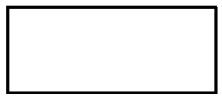
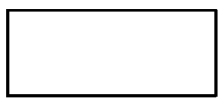
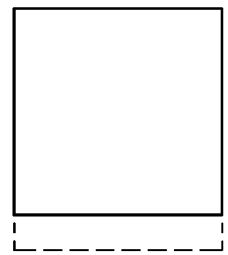
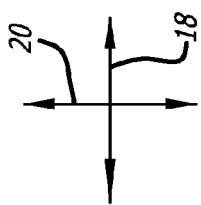
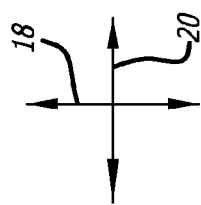
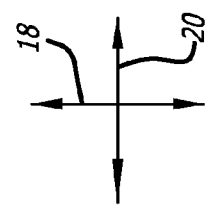

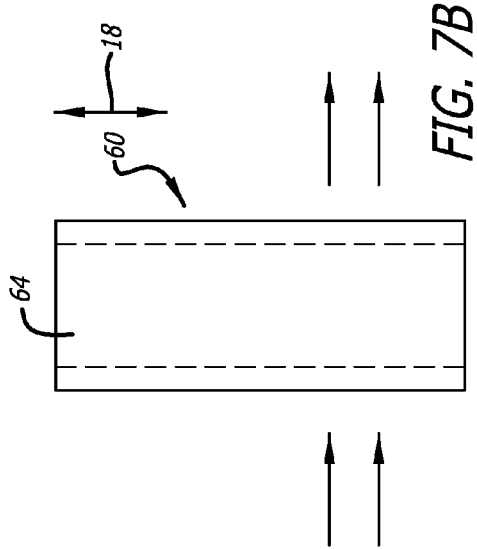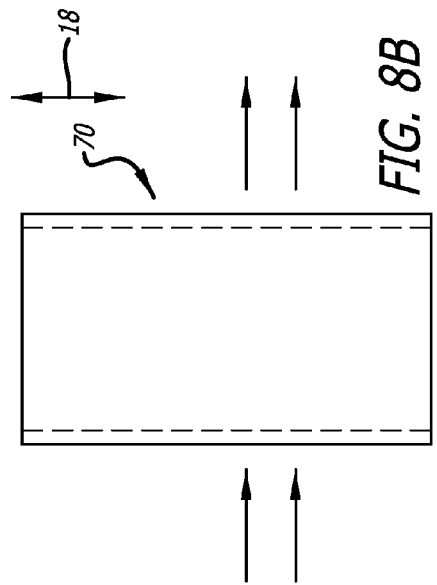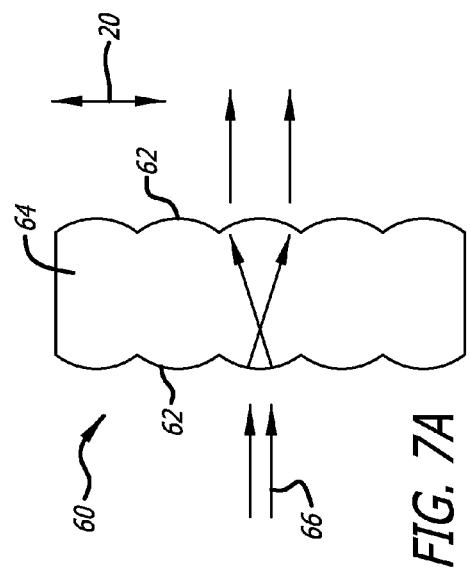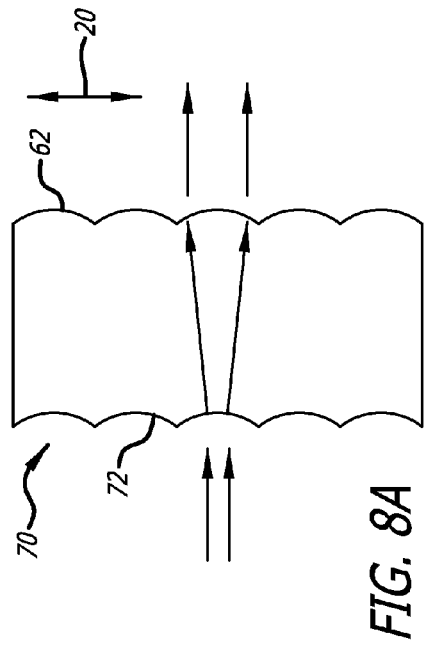

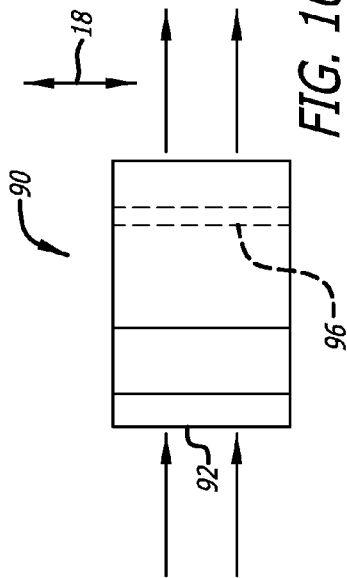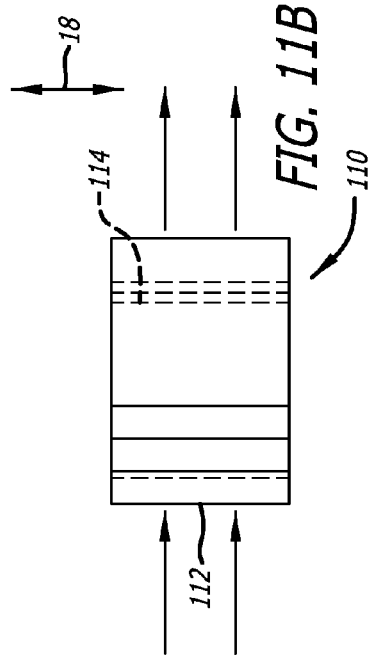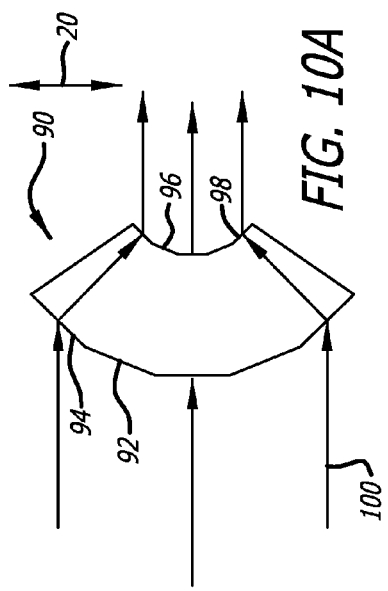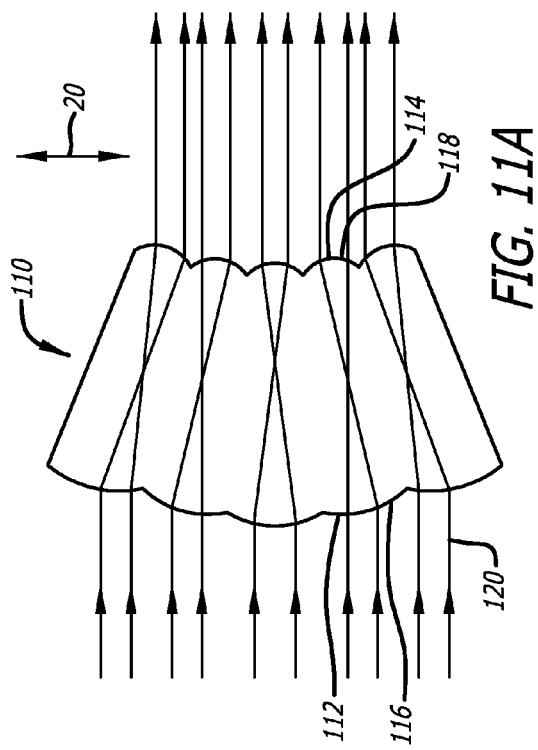

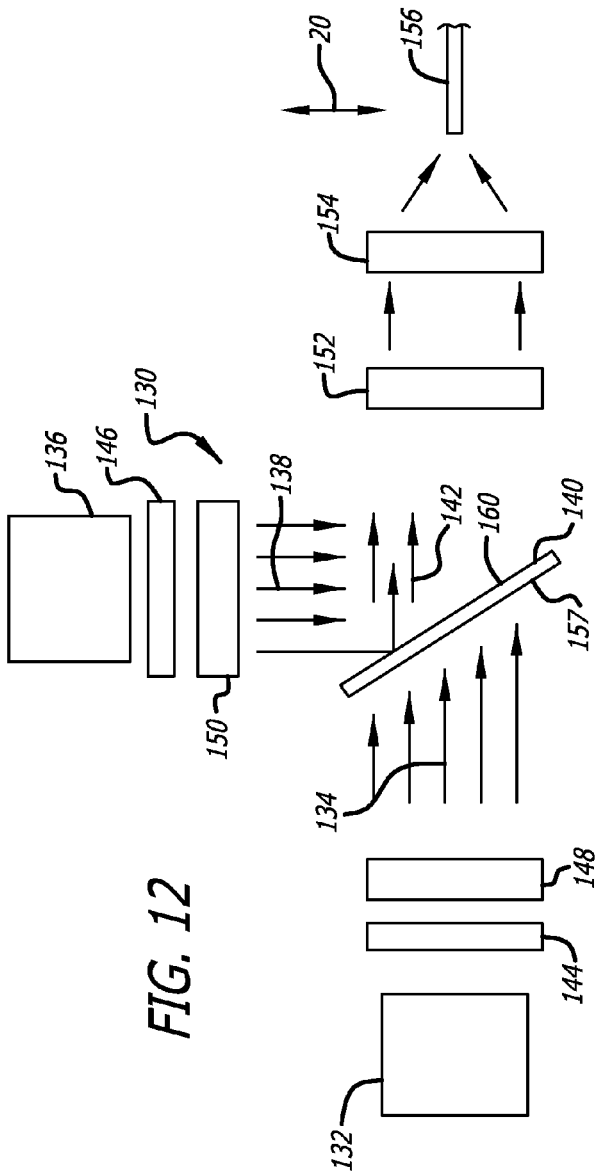
FIG. 12
FIG. 13A
FIG. 13B

HIGH BRIGHTNESS DIODE OUTPUT METHODS AND DEVICES

RELATED PATENT APPLICATIONS

This patent application is a divisional of U.S. patent application Ser. No. 12/990,215, filed on Jan. 12, 2011, entitled HIGH BRIGHTNESS DIODE OUTPUT METHODS AND DEVICES, naming Edmund L. Wolak, Oscar D. Romero, James Harrison and Sang-Ki Park as inventors, which is a national stage application under 35 U.S.C. section 371 of international patent application number PCT/US2009/043182, filed on May 7, 2009, entitled HIGH BRIGHTNESS DIODE OUTPUT METHODS AND DEVICES, naming Edmund L. Wolak, Oscar D. Romero, James Harrison and Sang-Ki Park as inventors, which claims the benefit of U.S. Provisional Patent Application No. 61/051,628, filed on May 8, 2008, entitled HIGH BRIGHTNESS DIODE OUTPUT METHODS AND DEVICES, each of which is hereby incorporated by reference herein, including all text, tables and drawings.

FIELD OF THE INVENTION

Optical systems and components thereof which may be used for maintaining the brightness of laser emitter bar output beams. Some embodiments may be useful for high efficiency coupling of laser emitter bar output beams or other suitable applications.

BACKGROUND

Applications requiring light energy and, in some embodiments, laser energy, may benefit from the use of solid state light sources such as laser diodes which are commonly available, reliable to operate and relatively cost effective as a laser energy source. Such devices may include a plurality of laser emitters in a single bar that emit laser light simultaneously in a common direction. In addition, multiple solid state or laser emitter bars may be disposed in a stacked configuration so as to generate even higher power levels.

Laser diode bars are often used for communication technology devices, medical applications and other applications such as military applications where it is desirable to couple the output of all the emitters of a single solid state emitter bar or multiple bars in a stacked configuration into a single optical fiber or other optical conduit. Typically the emitters of such solid state emitter bars generate significant amounts of heat during operation and are spaced from each other to allow sufficient cooling without the need for elaborate and expensive cooling systems. Such spacing improves the cooling of the bars, but may make coupling of the output beams from the multiple emitters difficult. The coupling of such output beams may require a large number of expensive optical components as well as a large area for mounting such optics.

In addition, for some applications, beam reformatting optics may be used in order to further enhance the coupling of the emitter output into a desired device. However, such beam formatting optics may further complicate the coupling process and reduce the brightness of the overall output of the bar by generating gaps between output beams of the individual emitters of a laser emitter bar or bars. One reason for this is that for some beam reformatting optics the size of the beamletts passing through the beam reformatting optic must be significantly smaller than the center to center spacing of a source laser emitter bar or the like. As such, brightness may be lost in the downstream optics.

What has been needed are methods and devices for maintaining the brightness and power of an output of multiple emitters of a laser emitter bar after the output has been reformatted. What has also been needed are devices and methods for coupling reformatted output beams of a laser emitter bar that use fewer optical elements or components.

SUMMARY

Some embodiments of an optical system include a laser emitter bar having an output with an output axis, a brightness enhancement optic operatively coupled to the output of the laser emitter bar and a fast axis collimator disposed between the laser emitter bar and the brightness enhancement optic and operatively coupled to the output of the laser emitter bar. The optical system may also include a beam reformatting optic which is configured to individually rotate output beams of emitters of the laser emitter bar and which is disposed between the brightness enhancement optic and the laser emitter bar and coupled the output of the laser emitter bar.

Some embodiments of a brightness enhancement optic include a faceted telescope configuration having an input surface with a plurality of adjacent input facets and an output surface with a plurality of adjacent output facets corresponding to each respective input facet. The input and output surfaces may be substantially parallel to each other and may be configured to refract substantially parallel input beams through the optic so as to exit the output facets parallel to each other and spaced closer together than the spacing of the parallel input beams.

Some embodiments of an optical system include a first laser emitter bar having a first output with a first output axis, a second later emitter bar having a second output with a second output axis which is oriented substantially perpendicular to the first output axis and a brightness enhancement optic operatively coupled to the first output and second output which is configured to redirect the second output to a propagation direction substantially parallel to the propagation direction of the first output and interleave the first and second outputs. The optical system may also include a first fast axis collimator disposed between the first laser emitter bar and the brightness enhancement optic and operatively coupled to the first output of the first laser emitter bar and a second fast axis collimator disposed between the second laser emitter bar and the brightness enhancement optic and operatively coupled to the second output of the second laser emitter bar. The system may also include a first beam reformatting optic disposed between the first laser emitter bar and the brightness enhancement optic and operatively coupled to the first output of the first laser emitter bar and a second beam reformatting optic disposed between the first laser emitter bar and the brightness enhancement optic and operatively coupled to the second output of the second laser emitter bar. For some of these embodiments, the brightness enhancement optic includes a periodic interleaver having an output surface with optically transmissive sections alternating with optically reflective sections. For such embodiments, each beam of the first output of the first laser emitter bar may be directed to an optically transmissive section and each beam of the second output of the second laser emitter bar is reflected by a reflective section in a direction substantially parallel to the direction of the first output.

Some embodiments of an integrated optical lens include a lens body having a first surface and a second surface which together are configured to both focus an output of a laser emitter bar and substantially collimate an output of a laser emitter bar in a slow axis direction. For some of these embodiments, the first surface includes an aspheric lens configured to focus an output of a laser emitter bar and the second surface includes an acylindrical lens configured to substantially collimate an output of a laser emitter bar in a slow axis direction.

Some embodiments of an optical system include a laser emitter bar having an output with an output axis, a fast axis collimator operatively coupled to the output of the laser emitter bar and an integrated optical lens comprising a lens body having an first surface and a second surface which together are configured to both focus an output of a laser emitter bar and substantially collimate an output of a laser emitter bar in a slow axis direction. For some of these embodiments, the first surface of the integrated optical lens includes an aspheric lens configured to focus an output of a laser emitter bar and the second surface of the integrated optical lens includes an acylindrical lens configured to substantially collimate an output of a laser emitter bar in a slow axis direction.

Some embodiments of a method of processing an output of at least one laser emitter bar includes emitting a plurality of substantially parallel beamletts from a plurality of laser emitters, substantially collimating the beamletts in a fast axis direction, reformatting the beamletts by rotation of each beamlett and enhancing the brightness of the beamletts by passing the beamletts through a brightness enhancement optic. Some of these embodiments may also include substantially collimating the beamletts in a slow axis direction.

These features of embodiments will become more apparent from the following detailed description when taken in conjunction with the accompanying exemplary drawings.

BRIEF DESCRIPTION OF THE DRAWINGS

FIG. 4A illustrates an elevation view of an embodiment of an optical system.

FIG. 4B illustrates a top view of the optical system of FIG. 4A.

FIG. 4C is a sectional view of the beams of the emitters of the laser emitter bar of FIGS. 4A and 4B between the fast axis collimator and the beam reformatting optic.

FIG. 4D is a sectional view of the beams of the emitters of FIGS. 4A and 4B between the beam reformatting optic and the brightness enhancement optic.

FIG. 4E is a sectional view of the beams output of the brightness enhancement optic in FIGS. 4A and 4B.

FIG. 7A illustrates a top view of an embodiment of a brightness enhancement optic.

FIG. 7B illustrates a side view of the brightness enhancement optic of FIG. 7A.

FIG. 8A illustrates a top view of an embodiment of a brightness enhancement optic.

FIG. 8B illustrates a side view of the brightness enhancement optic of FIG. 8A.

FIG. 10A illustrates a top view of an embodiment of a brightness enhancement optic.

FIG. 10B illustrates a side view of the embodiment of the brightness enhancement optic of FIG. 10A.

FIG. 11A illustrates a top view of an embodiment of a brightness enhancement optic.

FIG. 11B illustrates a side view of the embodiment of the brightness enhancement optic of FIG. 11A.

FIG. 12 is a top view of an embodiment of an optical system embodiment having two laser emitter bars and a brightness enhancement optic.

FIG. 13A is a side view of an embodiment of an interleaver brightness enhancement optic.

FIG. 13B is a top view of the interleaver brightness enhancement optic embodiment of FIG. 13A.

DETAILED DESCRIPTION

Embodiments discussed herein are directed to methods and devices for processing an output of emitters such as laser emitter bars or chips having one or more emitters disposed therein. Embodiments discussed herein are also directed to methods and devices for coupling an output of laser emitter bars to an optical conduit, such as an optical fiber. Such bars or chips may be mounted to or otherwise incorporated into optical system embodiments by a variety of methods. For such optical packages, it is important that the output array of the chips be properly aligned, that such alignment may be carried out conveniently and accurately and that the final configuration dissipate the heat generated by the chip efficiently. For some embodiments, it may be desirable to minimize the number of optical components used in an optical system in order to save space and cost of the optical system.

Figure 1:
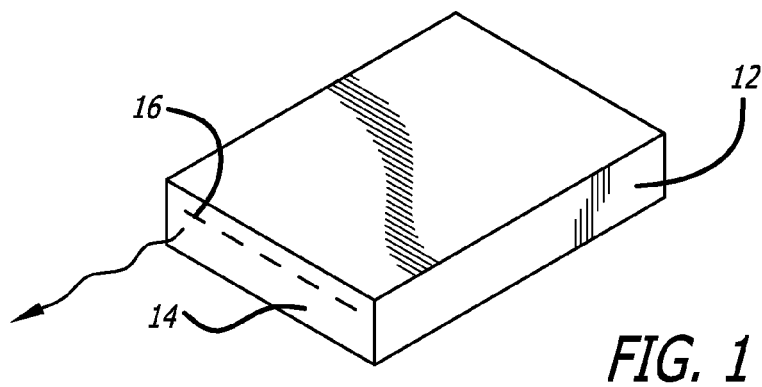
FIG. 1 is a perspective view of an embodiment laser emitter bar.
Figure 2:
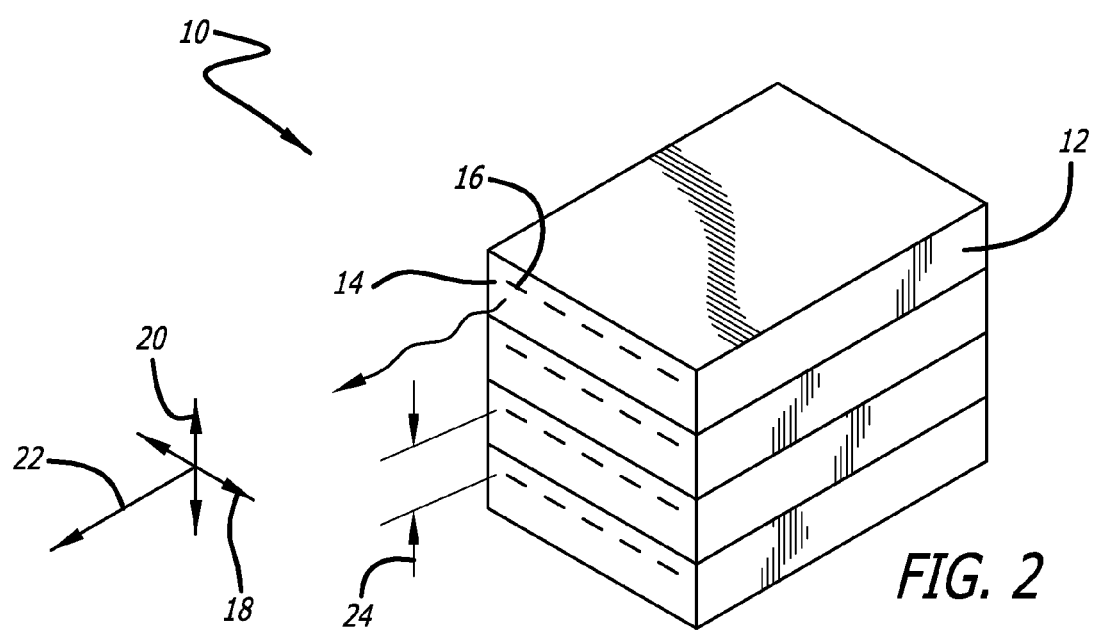
FIG. 2 is a perspective view of an embodiment of a stacked array of laser emitter bars.
Figure 3:
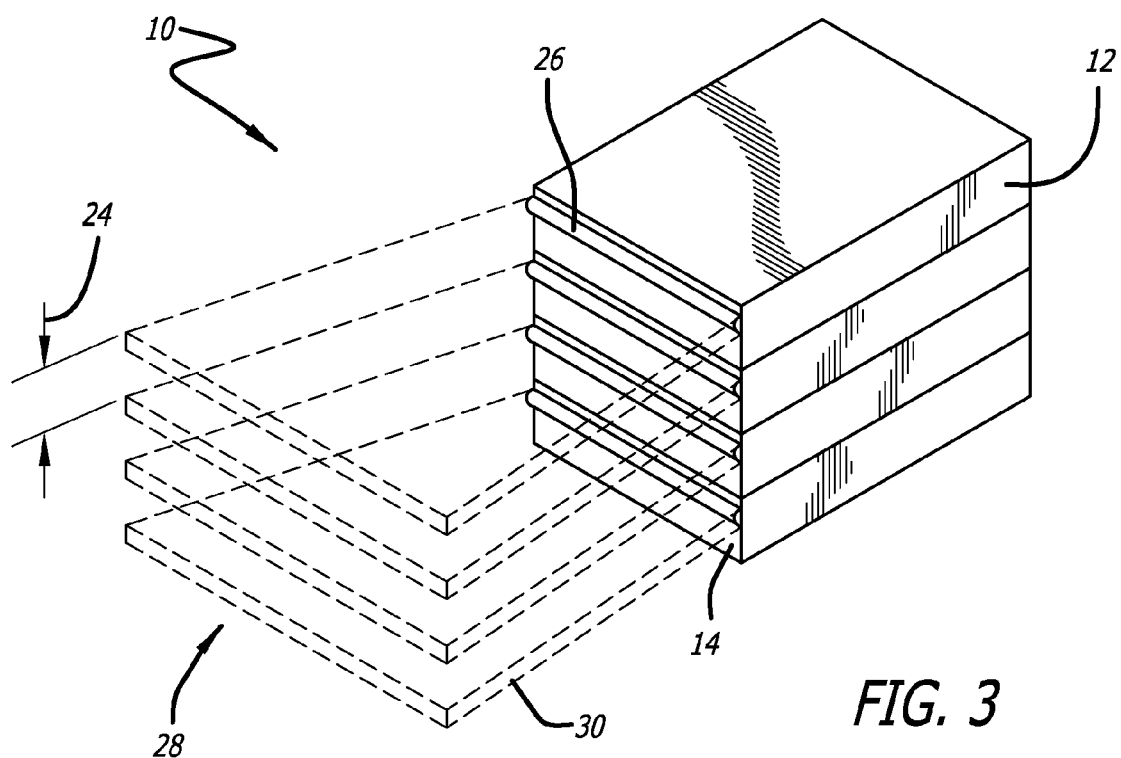
FIG. 3 shows an emission array of the laser emitter bars of the stacked array embodiment of FIG. 2.

FIG. 1 shows a laser emitter bar 12 having an output surface 14 that includes a total of 5 emitters 16 which have optical axes that are substantially parallel to each other. Although embodiments discussed herein are generally directed to use with single emitter bars, FIGS. 2 and 3 show a stacked array 10 of 4 laser emitter bars 12 that may be used with some embodiments. Each laser emitter bar 12 has an output surface 14 that includes a total of 5 emitters 16 disposed adjacent each other. The emitters 16 of each bar 12 are disposed in a substantially linear row along a slow axis direction of the emitters 16, as indicated by arrow 18. A fast axis direction of the emitters 16 is perpendicular to the slow axis direction 18 and is indicated by arrow 20. The emitters 16 are positioned or otherwise configured so as to emit light energy in output beams that propagate along an emission axis 22 which may be perpendicular to both the slow axis direction 18 and fast axis direction 20. The emission axes 22 of the emitters 16 of the stacked array may be substantially parallel to each other.

The laser emitter bars 12 are stacked along a fast axis direction 20 of the emitters 16 and may be stacked in a periodic and regular distribution. In the embodiment of FIG. 2, the emitters of a bottom laser emitter bar 12 are vertically separated from the emitters of an adjacent laser emitter bar 12 by a distance indicated by arrow 24 which may be referred to as the pitch of the stacked array 10. For some stacked array embodiments 10, the pitch indicated by arrow 24 may be about 1 mm to about 3 mm, specifically, about 1.5 mm to about 2.0 mm. Such a stacked array 10 of laser emitter bars 12 and emitters 16 may allow a large amount of light energy or power to be produced in a compact device for some embodiments.

Laser emitter bar embodiments 12 may have any suitable number of emitters 16, such as about 1 emitter to about 100 emitters, more specifically, about 3 emitters to about 12 emitters. For some embodiments, each laser emitter bar 12 having about 5 emitters 16 may have an output power of about 5 Watts (W) to about 90 W, more specifically, about 15 W to about 70 W, and even more specifically, about 20 W to about 30 W. Emitters 16 may include laser diodes such as edge emitting laser diodes, vertical cavity surface emitting lasers (VCSELs) and the like. Materials for the emitters 16 of the laser emitter bar 12 may include semiconductor materials such as GaAs, InP or any other suitable laser gain medium.

Generally, the emitting aperture of a laser diode embodiment of an emitter 16 is rectangular in shape with the long dimension of the emitter 16 having a size of typically tens or hundreds of microns, while the short dimension is typically one to several microns in size. Radiation emerging from an emitter 16 diverges with the divergence angle being greater along the short emitter 16 direction. Divergence angles are lower in the direction of the long emitter 16 direction. Some embodiments of the emitters 16 may have a physical width of about 30 microns to about 300 microns, more specifically, about 50 microns to about 200 microns, and the emitters may have a height of about 1 micron to about 3 microns. Some emitter embodiments may have a cavity length of about 0.5 mm to about 10 mm, more specifically, about 1 mm to about 7 mm, and even more specifically, about 3 mm to about 6 mm. Such emitter embodiments 16 may have a divergence of light energy output of about 2 degrees to about 14 degrees, more specifically, about 4 degrees to about 12 degrees, in the slow axis direction 18 and a divergence of light energy output of about 30 degrees to about 75 degrees in the fast axis direction 20.

Some embodiments of the laser diode bars 12 may have emitters 16 that emit light energy having a wavelength of about 700 nm to about 1500 nm, more specifically, about 800 nm to about 1000 nm. Emitters 16 may emit light having a centroid or peak wavelength of about 300 nm to about 2000 nm, more specifically, of about 600 nm to about 1000 nm, including wavelengths across the near infrared spectrum. Some particular embodiments of useful emitters may emit light at a peak wavelength of about 350 nm to about 550 nm, 600 nm to about 1350 nm or about 1450 nm to about 2000 nm.

Such laser diode bars may be operated in either a pulsed mode or continuous wave mode. Frequently, the output spectral band of individual emitters 16 which are not wavelength controlled (for example wavelength controlled by providing wavelength-dependent feedback from a volume index grating or the like) may be about 0.5 nm to about 2.0 nm or more. Due to the variation in peak emission wavelength in addition to the spectral band for each individual emitter, the overall bandwidth of the laser emitter bar 12 may be about 2 nm to about 5 nm, for some embodiments. Stacked array 10 includes 4 laser emitter bars 12, however, other embodiments of stacked arrays 10 may have any suitable number of laser emitter bars 12. Some stacked array embodiments 10 may have about 2 laser emitter bars 12 to about 30 laser emitter bars 12, more specifically, about 2 laser emitter bars 12 to about 10 laser emitter bars 12.

Referring to FIG. 3, stacked array 10 is shown with a fast axis collimator 26 in the form of a cylindrical lens array disposed over the emitters 16 of the stacked array 10 and configured to substantially collimate an output beam of the emitters 16 of each laser emitter bar 12 in a fast axis direction 20. Although the embodiment shown in FIG. 3 illustrates the fast axis collimator secured directly to the bars 12, the same collimating effect may be achieved with the fast axis collimator 26 secured apart from and in fixed relation to the bar or bars 12 as will be discussed in more detail below. Fast axis collimator 26 may include one cylindrical lens for each laser emitter bar 12 or one or more monolithic lens arrays as well as any other suitable configuration. This fast axis collimation of the emitter output produces an output array 28 as shown wherein the light energy output 30 of each emitter 16 of each laser emitter bar 12 is substantially collimated along the fast axis 20 of the emitters 16 but continues to diverge along the slow axis 18 of the emitters 16. The light energy outputs 30 of each laser emitter bar 12 may have a substantially rectangular cross section transverse to the direction of propagation and are parallel to each other so as to produce the output array 28 as shown. The arrangement discussed above with regard to the fast axis collimators 26 of the stacked array shown in FIG. 3 may also be used with regard to a single emitter bar 12.

As discussed above, there remains a needed for methods and devices that are suitable for maintaining the brightness and power of an output of multiple emitters of a laser emitter bar after the output has been reformatted. There also remains a need for devices and methods suitable for coupling reformatted output beams of a laser emitter bar that use fewer optical elements or components. FIGS. 4A and 4B show an optical system 30 that includes a laser emitter bar 12 having 5 emitters 16 that may emit an output when activated and that has an output axis as shown in FIG. 2 discussed above. A brightness enhancement optic 32 is substantially aligned with the output axis of the laser emitter bar 12 and is positioned and oriented so as to be operatively coupled to the output of the laser emitter bar after the emitter output has passed through a fast axis collimator 34 disposed adjacent the emitter bar 12 and operatively coupled to the output beams thereof. The fast axis collimator 34 may also be disposed between the laser emitter bar 12 and the brightness enhancement optic 32. The fast axis collimator serves to substantially collimate the emitter output beams of the emitters 16 in a fast axis direction. A beam reformatting optic 36 which is configured to individually rotate output beams of emitters of the laser emitter bar 12 about a longitudinal axis of each emitter beam is disposed between the brightness enhancement optic 32 and the laser emitter bar. For some embodiments, the beam reformatting optic 36 may be positioned between the fast axis collimator 34 and brightness enhancement optic 32 as shown in FIGS.

4A and 4B. The beam reformatting optic 36 is also positioned and oriented so as to be operatively coupled the output of the laser emitter bar 12 that has passed through the fast axis collimator 34.

The brightness enhancement optic 32 is generally configured to maintain or minimize reduction of brightness of the optical system. As such, as used herein, the term brightness enhancement or other similar terms are generally directed to the maintenance of brightness or the minimization of brightness reduction in the optical systems and methods discussed herein. It is understood that the device and method embodiments discussed herein do not increase the level of brightness.

The optical system 30 also includes a slow axis collimator 38 which is positioned and oriented so as to be operatively coupled the output of the laser emitter bar 12 that is emitted from the brightness enhancement optic 32. The slow axis collimator 38 may be configured to substantially collimate an output of the laser emitter bar in a slow axis direction. The slow axis collimator 38 may be disposed between the brightness enhancement optic 32 and a focusing optic 40. The optional focusing optics 40 may be disposed after the slow axis collimator 38 and may be positioned and oriented so as to be operatively coupled to the output of the laser emitter bar which is emitted from the slow axis collimator 38. The focusing optic 40 may be configured to focus the output from the slow axis collimator 38 into an optical conduit 41, such as an optical fiber or the like.

Embodiments of the slow axis collimator 38, focusing optic 40, and fast axis collimator 34 may have a standard configuration as a cylindrical lens, spherical lens, aspherical lens or the like made from any suitable optical material or materials such as glass, quartz, silica and the like. For some embodiments, the fast axis collimator 34 may have a width that is substantially the same as or greater than the width of the laser emitter bar 12.

In operation, the laser emitter bar 12 is activated such that each emitter 16 of the bar 12 emits an output beam having an optical axis substantially parallel to output beams of the other emitters 16 of the bar 12. The output beams then pass through the fast axis collimator 34 which substantially collimates each of the output beams in a fast axis direction. A sectional view of an embodiment of output beams emitted from the fast axis collimator 34 is shown in FIG. 4C which shows each of the 5 output beams having a substantially horizontal orientation that is collimated in the fast axis direction as indicated by arrow 20 and still diverging in the slow axis direction, as indicated by arrow 18. After passing through the fast axis collimator 34, the output beams are then passed through the beam reformatting optic 36 which may rotate each of the output beams about 85 to about 95 degrees about a longitudinal axis of each output beam and while maintaining the output beams substantially parallel to each other. This process effectively switches the fast axis orientation and slow axis orientation of the output beams such that the section view of the output beams between the beam reformatting optic 36 and the brightness enhancement optic 32 may look like the beam sections in FIG. 4D for some embodiments.

The beam sections in FIG. 4D have elongated slow axis components due to the divergence of the output beams in a slow axis direction between the fast axis collimator 34 and the brightness enhancement optic 32. The beam sections in the fast axis direction have remained fairly constant relative to the beam sections of FIG. 4C due to the collimation in that orientation by the fast axis collimator 34. As can be seen in the section view of the output beams, there are significant gaps between adjacent beams in the fast axis direction due to the narrow profile of the beams and due to the combination of the beamlett cross sections and the de-facto apertures inherent in the beam reformatting optic itself. Specifically, the beamlett cross sections post fast axis collimator 34 are typically rectangular in overall geometry, while many of the beam reformatting optics 36 work by reflective or refractive means often including de-facto apertures at about 45 degree orientations to the principle planes of the rectangular shape. Some re-formatting optics 36 work by other means (e.g. the Southampton multi-mirror), which still result in gaps due to manufacturing issues (coating transitions, shape transitions for refractive optics etc.). These gaps may then be addressed by various brightness enhancement optic embodiments 32.

The output beams having the section profile shown in FIG. 4D then pass through the brightness enhancement optic 32 which expands each of the output beams individually in the fast axis direction 20 while maintaining the beams parallel to each other and avoiding any unnecessary introduction of divergence. Some suitable brightness enhancement optics include telescope optic lens arrays discussed below. For some embodiments, the telescope lens elements of such an array may have the same or similar pitch to the pitch of the laser emitter bar 12. Such telescope lens arrays as well as other optics may expand the output beams in a fast axis direction 20 such that the output beam section after the brightness enhancement optic may look like the section view in FIG. 4E. In FIG. 4E, each of the output beams has been expanded by the operation of the brightness enhancement optic 32 in the fast axis direction such that the output beams are now adjacent or overlapping each other in the fast axis direction. The array of output beams that now appear more as a single large output beam may then be passed through a slow axis collimating element such as the slow axis collimator 38 and then focused into the optical conduit 41 which may be an optical fiber of any suitable size and configuration.

Figure 5:
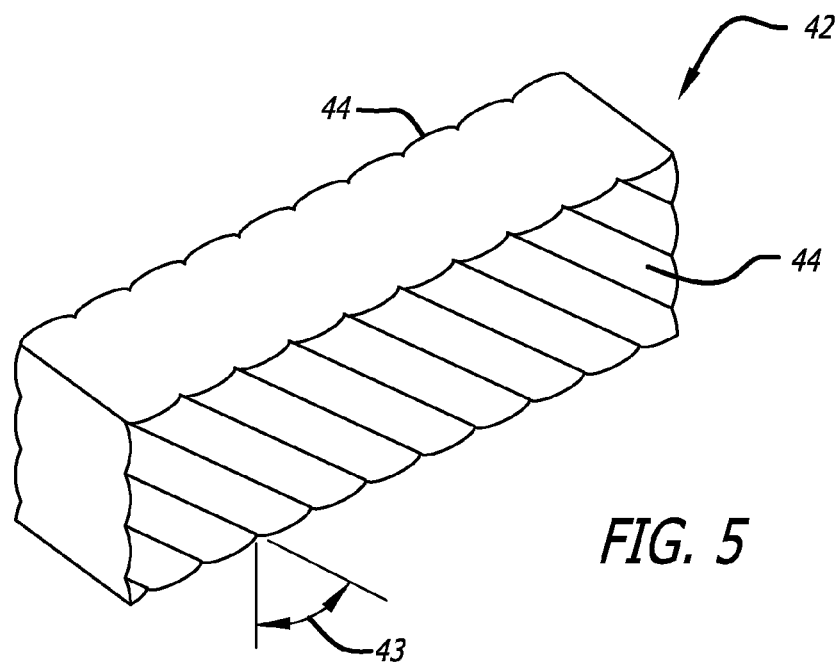
FIG. 5 illustrates an embodiment of a reformatting optic.

For some embodiments, the beam reformatting optic 36 may include an optical element that serves to rotate each individual beamlett of the output of the emitters 16 of the laser emitter bar 12 as discussed above. FIG. 5 illustrates an embodiment of a refractive beam reformatting optic 42 that includes an array of opposed pairs of diagonally oriented cylindrical lenses 44. Each opposed pair of lenses of the beam reformatting optic 42 may have a lateral separation or pitch that is substantially the same as the lateral separation or pitch of the individual emitters 16 of the laser emitter bar 12 of the system. Each lens of an opposed pair of cylindrical lenses may also be set at an angle of about 90 degrees with respect to each other as shown in FIG. 5. The refractive beam reformatting optic 42 may be made from any suitable optical material such as glass, quartz, silica or the like. For some embodiments, the beam reformatting optic 36 includes a refractive offset cylindrical lens array for 90 degree beam rotation of each output from each emitter element 16 of an emitter bar 12.

Some embodiments of such a refractive offset cylindrical lens array may include diagonally oriented cylindrical lens elements that are symmetrically disposed on opposing parallel surfaces of a transmissive block or substrate that may be made of a refractive solid such as glass or silica. The transmissive block may be sized such that any opposing symmetrical pair of cylindrical lens elements focus at the same point or line within the body of the transmissive block. Such a configuration will rotate an incident output beam by approximately 90 degrees, such that the fast axis and slow axis of the output beam are reversed. The rotation of individual output beams 16 may be useful to symmetrize the beam product and beam profile between the fast axis and slow axis and facilitates subsequent focusing or concentration of the output beams while maintaining brightness. The slant or angular orientation of the cylindrical lens elements of the beam reformatting optic may be set to an angle of about 40 degrees to about 50 degrees, as indicated by arrow 43 in FIG. 5. Embodiments of refractive offset cylindrical lens arrays for 90 degree beam rotation, such as beam reformatting optic 42 may include products such as produced by LIMO GmbH, Bookenburgeweg 4-8, Dortmund, Germany.

Figure 6:
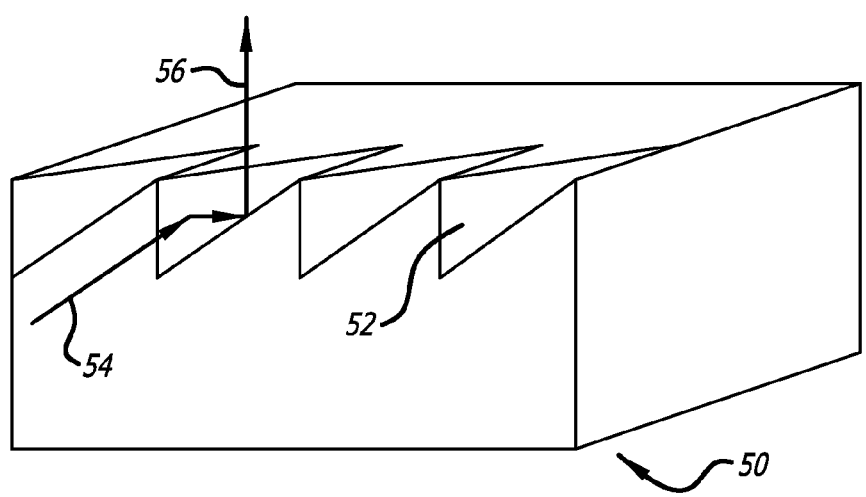
FIG. 6 illustrates an embodiment of a beam reformatting optic.

FIG. 6 shows an embodiment of a reflective or mirror based beam reformatting optic 50 that also serves to rotate each individual beamlett of the emitters 16 of the laser emitter bar 12 about a longitudinal axis of each beamlett. The reflective beam reformatting optic 50 includes a plurality of mirror pairs 52 set at 45 degrees to an optical path 54 of an incident beamlett that generate two sequential reflections that rotate each beamlett individually about a longitudinal axis of the output beam and relative to adjacent parallel propagating beamlett as shown by arrows 56. The mirrors 52 may be made from a high strength stable material and may include any suitable highly reflective coating or material to enhance reflectance of the surfaces. The amount of rotation about the beamlett axis may vary, but some embodiments may rotate each beamlett in the same direction and in substantially the same amount, for example rotation by about 80 degrees to about 100 degrees, more specifically, about 85 degrees to about 95 degrees.

The brightness enhancement optic 32 for the system of FIGS. 4A and 4B may include a variety of configurations that serve to maintain the brightness of an output of the emitters of a laser emitter bar. Some embodiments of brightness enhancement optics 32 may serve to fill in gaps between individual beamletts of the output of emitters of laser emitter bars, particularly after the output has be reformatted by a beam reformatting optic as discussed above. Some embodiments of brightness enhancement optics 32 serve to expand beamletts of emitters so as to fill in gaps between adjacent beamletts and may also serve to improve the collimation or reduce divergence of each beamlett. Some embodiments of brightness enhancement optics 32 may include telescope embodiments or optics. Some telescope optic embodiments of brightness enhancement optics may include a cylindrical telescope array having an opposed aligned pair of parallel cylindrical lenses for at least each emitter 16 of a laser emitter bar 12 to be used with the brightness enhancement optic 32. Some embodiments of brightness enhancement optics 32 may include a faceted telescope configuration having pairs of surfaces, including an input surface having a plurality of sequential facets and an output surface having a plurality of corresponding sequential facets disposed closer together than the facets of the first surface.

FIGS. 7A and 7B show a brightness enhancement optic 60 that includes a cylindrical telescope array of a Keplerian type having a plurality of opposed aligned pairs of parallel cylindrical lenses 62 disposed with an optical axis parallel and next to that of each adjacent pair of opposed aligned parallel cylindrical lenses. Each cylindrical lens of the opposed aligned pairs of parallel cylindrical lenses for the embodiment shown is a convex cylindrical lens. The cylindrical lenses are oriented with the convex portion disposed away from an optic body 64 forming an outer surface of the optic. The focal length and relative spacing of an input lens and output lens of each opposed pair of lenses may be configured to produce an expansion or power of a desired amount while maintaining each of the output beams substantially parallel to each other and without introducing divergence of the beams.

As illustrated by the arrows 66 in FIG. 7A, an incident beamlett from the laser emitter bar 12 is expanded laterally in a fast axis direction 20 by converging through a focal point due to the lensing of the convex input lens of the input surface. The input beam then re-expands within the optic past the focal point until the beam is re-collimated by the corresponding output lens which is also convex. The expansion may also reduce divergence of the beam an improve collimation so as to enhance the retention of the brightness. There is no appreciable net impact on divergence in the slow axis direction due to optic 60. The lenses of each side of the optic are substantially parallel to each other and may have a spacing or pitch that is substantially the same as the pitch of the individual emitters 16 of the laser emitter bar embodiment 12 coupled thereto. For some embodiments, the pitch of the lenses 62 may be about 0.3 mm to about 1.5 mm, more specifically, about 0.4 mm to about 1.2 mm. The optic 60 may be made from any suitable optical material including glass, quartz, silica or the like. Outer surfaces of the lenses 62 of the optic 60 may include any suitable anti-reflective coating or material in order to enhance transmission of light energy through the optic. For some embodiments, the power of the telescope elements of the optic 60 may be about 1.2 power to about 2.4 power, more specifically, about 1.4 power to about 1.7 power.

FIGS. 8A and 8B show an embodiment of a brightness enhancement optic 70 that includes a cylindrical telescope array of a Galilean type that may be similar in some respects to the Keplerian array of the embodiment shown in FIGS. 7A and 7B and discussed above. As shown in FIGS. 8A and 8B, the cylindrical lenses 72 on the input side of the optic 70 are concave instead of the convex lenses in the input array of lenses on optic 60 shown in FIGS. 7A and 7B. Once again, the focal length and relative spacing of an input lens and output lens of each opposed pair of lenses may be configured to produce an expansion or power of a desired amount while maintaining each of the output beams substantially parallel to each other and without introducing divergence of the beams. In some cases, the materials, dimensions and features of the enhancement optic 70 may also be the same as those of the embodiment 60 of FIGS. 7A and 7B. As shown in FIG. 8A, an incident beam indicated by the parallel arrows is refracted by the input concave lens of the input surface. The refraction of the input lens causes the beam to diverge within the optic 70 as indicated by the arrows within the optic 70. The beam is then re-collimated by the corresponding output lens on the output surface so as to expand the beam in a fast axis direction while maintaining the divergence of each output beam. There is no appreciable net impact on divergence in the slow axis direction due to optic 70.

Figure 9B:
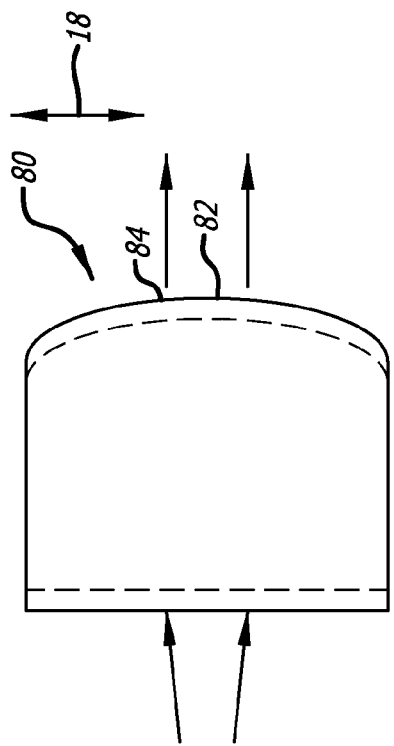
FIG. 9B shows a side view of the integrated brightness enhancement optic and slow axis collimator embodiment of FIG. 9A.
Figure 9A:
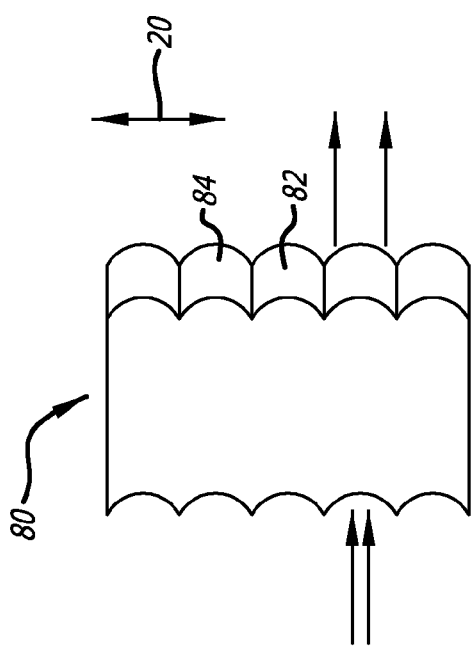
FIG. 9A shows a top view of an embodiment of an integrated brightness enhancement optic and slow axis collimator.

FIGS. 9A and 9B illustrate an embodiment of a brightness enhancement optic 80 that may have some of the same features, dimensions and materials as those of the optic embodiment 70 of FIGS. 8A and 8B. However, brightness enhancement optic 80 of FIGS. 9A and 9B includes a lensing configuration superimposed on an output surface thereof that is configured to serve as a slow axis collimator. The slow axis collimator lensing of the output surface may be used to replace the separate slow axis collimator optic 38 shown in FIGS. 4A and 4B. In such embodiments, the brightness enhancement optic 80 would take the place of the brightness enhancement optic 32 and slow axis collimator 38. As shown in FIGS. 8A and 8B, an output surface 82 of the optic 80 includes a cylindrical lensing configuration superimposed onto the output lenses 84 of the opposed aligned pairs of cylindrical lenses. In this configuration, each of the output lenses of the aligned pairs of lenses is curved in a lens configuration so as to produce convergence in a slow axis direction. The focal length of the lensing of the output surface 82 may be selected to efficiently collimate the output beams of the system to a desired level. The cylindrical lensing of the output surface 82 serves to substantially collimate output of the laser emitter bar 12 in a slow axis direction while the opposed aligned pairs of parallel cylindrical lenses serve to enhance or maintain the brightness of the beam output by expanding the beams in a fast axis direction as discussed above with regard to optic embodiment 70. For some embodiments, the focal length of the lensing of the output surface for slow axis collimation may be about 5 mm to about 50 mm, more specifically, about 10 mm to about 20 mm.

FIGS. 10A and 10B show a brightness enhancement optic 90 having a faceted telescope or plane parallel plate configuration. The faceted configuration of the optic 90 has an input surface 92 with a plurality of adjacent input facets 94 and an output surface 96 with a plurality of adjacent output facets 98 corresponding to each respective input facet 96. The paired input and output facets 94 and 98 may be parallel to each other and configured to refract substantially parallel input beams through the optic 90 such that the beams exit the output facets parallel to each other so as to maintain the divergence of the input beams. The output beams are spaced closer together than the spacing of the parallel input beams as shown by the arrows 100 of FIG. 10A. The closer spacing of the adjacent output beams of the emitters 16 may be used to maintain the brightness of the system for more efficient coupling and other applications. For some embodiments, a radius that the input facets 94 lie on and a radius that the output facets lie on, in conjunction with the material of the optic 90 and spacing of the paired facets may be selected to produce a desired amount of compression of adjacent output beams. For some embodiments, the optic 90 may be configured such that incident beams having a fill factor of about 40% to about 80%, may be laterally displaced or otherwise compressed to a fill factor of about 80% to about 100%. The fill factor measurement discussed herein refers to the amount of illuminated area within the overall beam profile of all the output beams. For example, the fill factor of the beam profile shown in FIG. 4D may be about 30% whereas the fill factor in the beam profile or section shown in FIG. 4E may be about 90%. There is no appreciable net impact on divergence in the slow axis direction due to optic 90.

For some embodiments of optic 90, each corresponding facet pair may include a pair of corresponding cylindrical lenses on the input and output facet surfaces of the optic as shown in the embodiment 110 of FIGS. 11A and 11B. The input surface 112 and output surface 114 of the opposed paired cylindrical lenses 116 and 118 may be substantially aligned to each other and configured to refract substantially parallel input beams through the optic such that the beams exit the output facets parallel to each other and spaced closer together than the spacing of the parallel input beams as shown by the arrows 120 of FIG. 11A. For the embodiment 110 shown, the output beams are neither expanded nor compressed in a fast axis direction 20 as shown by the beams passing through the lens pairs of the optic 110, which are configured with a power of about 1. The beams may also be collimated or have reduced divergence relative to the input beams due to the telescopic effect of the paired cylindrical lenses 116 and 118. For some embodiments, the pitch or spacing of the lenses or facets of the input surface may be about 0.3 mm to about 1.5 mm, more specifically, about 0.4 mm to about 1.2 mm. The optic 110 may be made from any suitable optical material including glass, quartz, silica or the like. Outer surfaces of the lenses of the optic may include any suitable anti-reflective coating or material in order to enhance transmission of light energy through the optic. Although the lens pairs of optic 110 shown have a power of about 1, the power of the telescope lens pairs of each facet of the optic 110 may have a power of about 0.5 power to about 1.5 power. Also, for some embodiments, a radius that the input lenses 116 lie on and a radius that the output lenses 118 lie on, in conjunction with the material of the optic 90 and spacing of the paired lenses 116 and 118 may be selected to produce a desired amount of compression of adjacent output beams in conjunction with the expansion or compression due to the lens pairs of the optic 110. For some embodiments, the optic 110 may be configured such that incident beams having a fill factor of about 40% to about 80%, may be laterally displaced, compressed and/or expanded to a fill factor of about 80% to about 100%. There is no appreciable net impact on divergence in the slow axis direction due to optic 110.

For some embodiments, a method of controlling an output of at least one laser emitter bar 12 using some of the optic embodiments discussed herein, may include emitting a plurality of substantially parallel beamlets from a plurality of laser emitters 16 of a laser emitter bar. The beamlets may be substantially collimated in a fast axis direction by the fast axis collimator which is operatively coupled to the output of the laser emitter bar 12. The output beamlets may then be reformatted by a beam reformatting optic 36 which may be configured to rotate each beamlet on a longitudinal axis thereof. Each beamlett may be rotated relative to adjacent beamletts while maintaining the position of the center or longitudinal axis of the beamlett relative to the centers or longitudinal axes of adjacent beamletts. The brightness of the beamletts overall may be enhanced or otherwise substantially maintained by passing the beamletts through a brightness enhancement optic 32, such as any of the brightness enhancement optics discussed herein. For some embodiments, the output beams may be substantially collimated in a slow axis direction by passing the beamletts through the slow axis collimator 38. For some embodiments, the output beams may be focused to a focal spot or pattern suitable for coupling into a transmitting core or the like of an optical conduit 41 by passing the beamletts through the focusing optics 40. Suitable optical conduits for coupling of the focused output beam of the laser emitter bar may include optical fibers, hollow reflectors, aligned mirror arrays or the like.

Another embodiment of an optical system for managing the output of a laser emitter bar 12 is shown in FIG. 12. The optical system embodiment 130 includes a first laser emitter bar 132 having a first output with a first output axis 134. A second later emitter bar 136 having a second output with a second output axis 138 is positioned such that the second output axis is substantially perpendicular to the first output axis 134. A brightness enhancement optic 140 is positioned and oriented so as to be operatively coupled to the first output and second output. The brightness enhancement optic 140 is configured to redirect the second output to a propagation direction substantially parallel to the propagation direction of the first output and interleave the first and second outputs from the respective first and second laser emitter bars as shown by arrows 142. A first fast axis collimator 144 is disposed between the first laser emitter bar 132 and the brightness enhancement optic 140 and is positioned and oriented so as to be operatively coupled to the first output of the first laser emitter bar 132. A second fast axis collimator 146 is disposed between the second laser emitter bar 136 and the brightness enhancement optic 140 and is positioned and oriented so as to be operatively coupled to the second output of the second laser emitter bar 136. A first beam reformatting optic 148 may be disposed between the first laser emitter bar 132 and the brightness enhancement optic 140 and is positioned and oriented so as to be operatively coupled to the first output of the first laser emitter bar 132. A second beam reformatting optic 150 is disposed between the second laser emitter bar 136 and the brightness enhancement optic 140. The second beam reformatting optic 150 is positioned and oriented such that it is operatively coupled to the second output of the second laser emitter bar 136.

For some embodiments, the system 130 includes a slow axis collimator 152 which is positioned and oriented so as to be operatively coupled to the first and second outputs of the first and second laser emitter bars 132 and 136 respectively. For some embodiments, the system includes a focusing optic 154 or optics positioned and oriented to be operatively coupled to an output of the brightness enhancement optic and configured to focus the output into an optical conduit 156, such as an optical fiber or the like. For some embodiments, the brightness enhancement optic 140 includes a periodic interleaver, as shown in more detail in FIGS. 13A-13D. The periodic interleaver 140 has an input surface 157 that may include an anti-reflective coating and an output surface 158 with optically transmissive sections 160 alternating with optically reflective sections 162. In use, each beam of the first output of the first laser emitter bar 132 is directed to an optically transmissive section of the interleaver and each beam of the second output of the second laser emitter bar 136 is reflected by a reflective section in a direction substantially parallel to the direction of the first output as shown by the arrows 142 in FIG. 12.

Figure 13C:
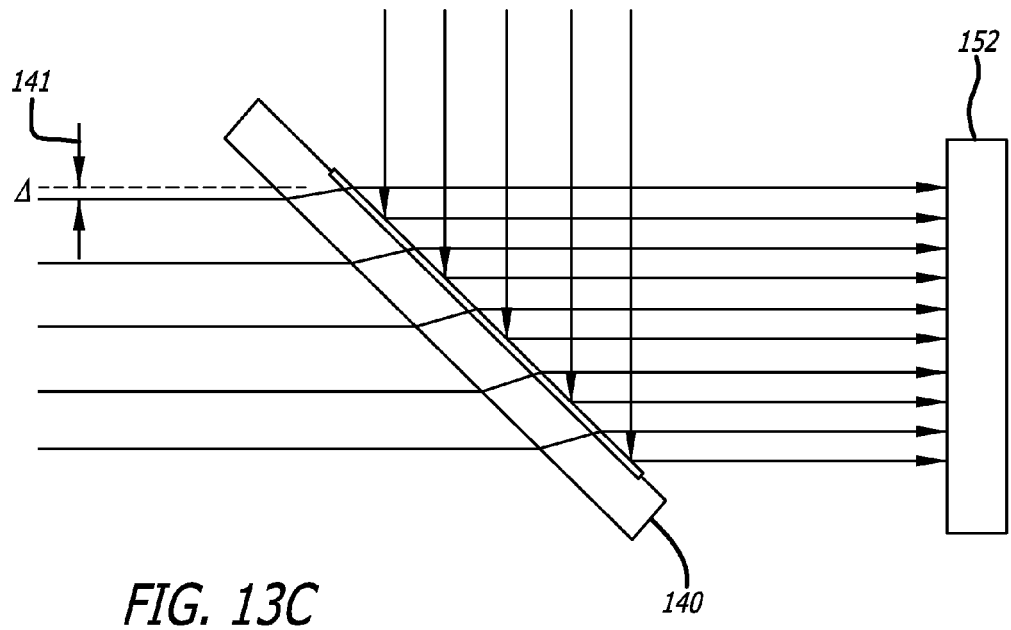
FIG. 13C is a top view of the interleaver brightness enhancement optic embodiment of FIG. 13A showing the optical path of the emitter output of the first and second emitter bars through the interleaver brightness enhancement optic.

For some embodiments, the optically transmissive sections 160 and optically reflective sections 162 of the periodic interleaver 140 are configured as parallel stripes of substantially equal width having a pitch that may be substantially the same pitch as the pitch of the laser emitter bar emitters multiplied by a factor of about 1.40 to about 1.42, or about the value of the square root of two in order to compensate for the angular orientation of the incident beams with respect to the surface of the interleaver 140. For some embodiments, a width of the optically reflective sections 162 and optically transmissive sections 160 may be substantially equal to a length equal to one half the pitch of the alternating sections. For some embodiments, the periodic interleaver 140 includes a plate 164 having substantially parallel surfaces which are disposed at an angle of about 45 degrees with respect to the first and second outputs 134 and 138 of the respective first and second laser emitter bars 132 and 136. For such embodiments, the path of the output beams may be interleaved by the optic 140 as shown in FIG. 13C. As shown, the reflected beams from the second emitter bar 136 are reflected from a position disposed between and/or adjacent the transmitted beams from the first emitter bar 132.

Figure 13D:
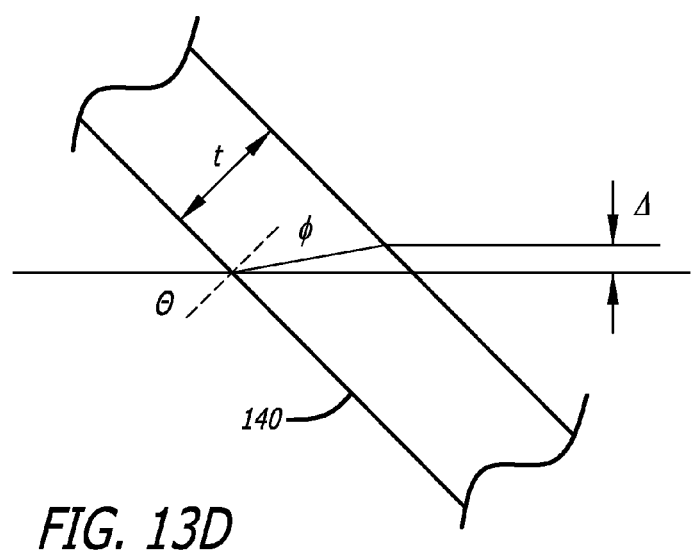
FIG. 13D illustrates the optical path of a single emitter output through the interleaver brightness enhancement optic of FIG. 13C and the resulting displacement of the optical path.

In addition, the thickness of such a plate may cause lateral displacement of a beam that passes through the plate from the first laser emitter bar as shown in FIG. 13C and indicated by the arrows 141 and the symbol Δ (delta). For some embodiments, the first output may be laterally displaced by refraction through the thickness of the plate by a predetermined formula. For some embodiments, the formula for lateral displacement is $\Delta = t \times (\sin(\theta - \phi)/\cos \phi)$ where $\sin \theta = n \sin \phi$ and where t is the thickness and n is the index of refraction of the interleaver 140. For this relation, $\theta$ and $\phi$ are the angles relative to the surfaces of the interleaver 140 as shown in FIG. 13D.

Figure 14A:
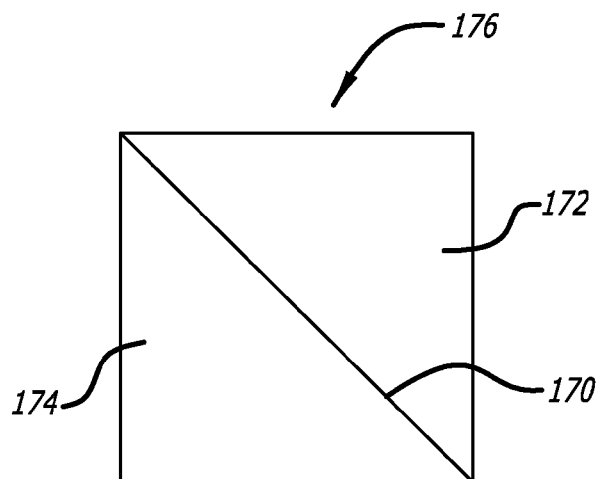
FIG. 14A is a top view of an embodiment of an interleaver brightness enhancement optic.
Figure 14B:
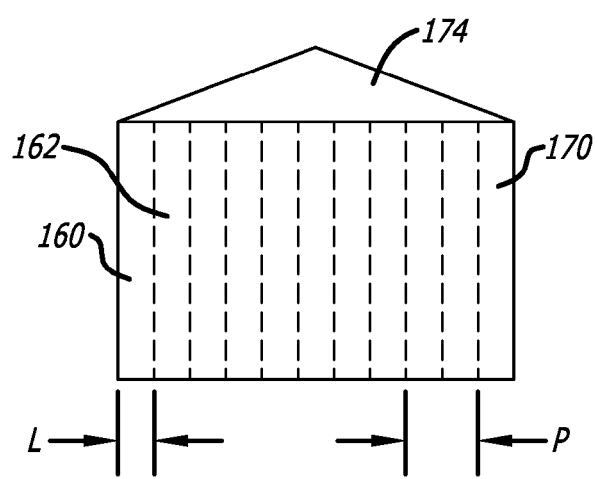
FIG. 14B is a perspective view of the interleaver brightness enhancement optic of FIG. 14A shown without one prism element and illustrating an embodiment of an interleave surface of the other prism element.
Figure 14C:
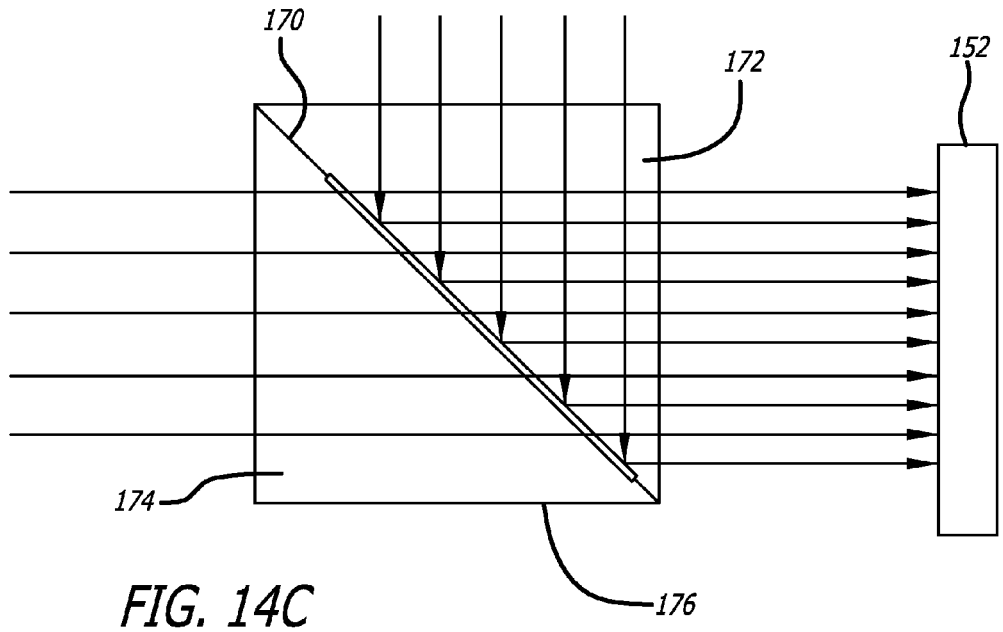
FIG. 14C is a top view of the interleaver brightness enhancement optic of FIG. 14A showing the optical path of the emitter output of the first and second emitter bars.

In addition to the plate embodiment of the periodic interleaver, some embodiments of the periodic interleaver may include a pair of prisms, such as triangular prisms, wherein a periodic interleaver 170 is formed at a surface of the junction between a surfaces of the prisms 172 and 174 as shown in the embodiment 176 of FIGS. 14A-14C. For some embodiments, the optically transmissive sections 160 and optically reflective sections 162 may be formed on one of the surfaces of the junction between the two prisms. The sections 160 and 162 formed on one or more of the surfaces of the prisms 172 and 174 may have the same or similar features, dimensions and materials as sections 160 and 162 of the periodic interleaver 140 discussed above. It may not be necessary to account for the refractive displacement Δ discussed above as the prism embodiments of interleaver 170 avoid the passage of beams through the parallel plate of 140. The optical path of the beams from the first and second bars 132 and 136 and through the optic 170 can be seen in FIG. 14C. For such embodiments, the path of the output beams may be interleaved by the optic 170. As shown, the reflected beams from the second emitter bar 136 are reflected from a position disposed between and/or adjacent the transmitted beams from the first emitter bar 132. Either optic 140 or 170 may be used with the system 130 shown in FIG. 12.

Figure 15A:
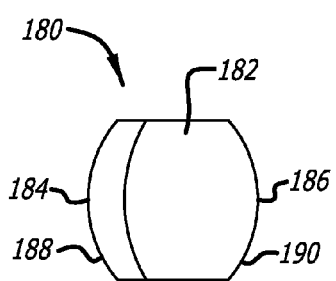
FIG. 15A is a top view of an embodiment of an integrated optical lens.
Figure 15B:
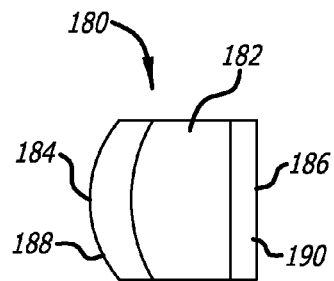
FIG. 15B is a side view of the integrated optical lens embodiment of FIG. 15A.

As discussed above, it may be desirable for some embodiments of optical systems to minimize the number of optical elements of the system, to minimize the space taken by the optical elements of the system or both. FIGS. 15A and 15B illustrate an integrated optical lens 180 that includes a lens body 182 having a first surface 184 and a second surface 186 which together are configured to both focus an output of a laser emitter bar and substantially collimate an output of a laser emitter bar in a slow axis direction. For some embodiments, the first surface 184 may include an aspheric lens 188 configured to focus an output of a laser emitter bar 12 and the second surface 186 may include an acylindrical lens 190 configured to substantially collimate an output of a laser emitter bar in a slow axis direction. For some embodiments, an acylindrical lens 190 of the second surface 186 may include a substantially hyperbolic shape. For some embodiments, the first surface 184 may include an input surface of the lens body 182 and the second surface 186 may include an output surface of the lens body 182. Such configurations may also be modified or reversed with regard to the lensing functions of the input surface 184 and output surface 186 of the integrated optical lens.

Figure 16A:
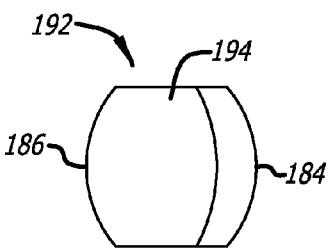
FIG. 16A is a top view of an embodiment of an integrated optical lens.
Figure 16B:
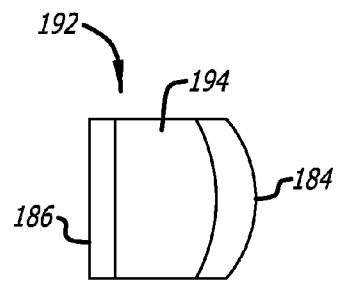
FIG. 16B is a side view of the integrated optical lens embodiment of FIG. 16A.

Referring to FIGS. 16A and 16B, an integrated lens 192 is illustrated having a lens body 194 and the same or similar features, dimensions and materials as those of the embodiment of FIGS. 15A and 15B, with the exception that the first surface 184 includes an output surface of the lens body and the second surface 186 includes an input surface of the lens body. The integrated optics 180 and 192 shown may be substituted for the focusing optics and slow axis collimator for any of the optical systems discussed above. For any of the integrated optics, the lens body may be formed by a molding process, a grinding process, a lithographic etching process or any other suitable process. In addition, the integrated lens embodiments may be made from any suitable optical material such as glass, quartz, silica or the like.

Such integrated optics may be incorporated into any of the optical system embodiments discussed herein. For example, an optical system (not shown) may include a laser emitter bar 12 having an output with an output axis, a fast axis collimator 34 operatively coupled to the output of the laser emitter bar 12 and an integrated optical lens 180 including a lens body 182 having an first surface and a second surface which together are configured to both focus an output of a laser emitter bar and substantially collimate an output of a laser emitter bar in a slow axis direction. For some embodiments, the first surface of the composite optical lens may include an aspheric lens configured to focus an output of a laser emitter bar and the second surface of the integrated optical lens may include an acylindrical lens configured to substantially collimate an output of a laser emitter bar in a slow axis direction. For some embodiments, the system may further include a brightness enhancement optic 32 which is operatively coupled to the output of the laser emitter bar 12 and which is disposed between the fast axis collimator 34 and the integrated optical lens 180. For some embodiments, the system may further include a beam reformatting optic 36 which is configured to individually rotate output beams of emitters of the laser emitter bar 12 and which is disposed between the brightness enhancement optic 32 and the laser emitter bar 12 and coupled the output of the laser emitter bar.

With regard to the above detailed description, like reference numerals used therein refer to like elements that may have the same or similar dimensions, materials and configurations. While particular forms of embodiments have been illustrated and described, it will be apparent that various modifications can be made without departing from the spirit and scope of the embodiments of the invention. Accordingly, it is not intended that the invention be limited by the forgoing detailed description.

What is claimed is:

1. An optical system, comprising:
   a first laser emitter bar having a first output with a first output axis;
   a second laser emitter bar having a second output with a second output axis which is oriented substantially perpendicular to the first output axis;
   a brightness enhancement optic which is operatively coupled to the first output and second output, which is configured to redirect the second output to a propagation direction substantially parallel to the propagation direction of the first output and interleave the first and second outputs, and which comprises a periodic interleaver having an output surface with optically transmissive sections alternating with optically reflective sections wherein each beam of the first output of the first laser emitter bar is directed to an optically transmissive section and each beam of the second output of the second laser emitter bar is reflected by a reflective section in a direction substantially parallel to the direction of the first output and wherein the optically transmissive sections and optically reflective sections are configured as parallel stripes of substantially equal width having a pitch that is substantially the pitch of the laser emitter bar emitters multiplied by about 1.40 to about 1.42;
   a first fast axis collimator disposed between the first laser emitter bar and the brightness enhancement optic and operatively coupled to the first output of the first laser emitter bar;
   a second fast axis collimator disposed between the second laser emitter bar and the brightness enhancement optic and operatively coupled to the second output of the second laser emitter bar;
   a first beam reformatting optic disposed between the first laser emitter bar and the brightness enhancement optic and operatively coupled to the first output of the first laser emitter bar; and
   a second beam reformatting optic disposed between the first laser emitter bar and the brightness enhancement optic and operatively coupled to the second output of the second laser emitter bar.

2. The system of claim 1 further comprising a slow axis collimator operatively coupled the first and second outputs of the first and second laser emitter bars respectively.

3. The system of claim 1 further comprising focusing optics operatively coupled to an output of the brightness enhancement optic.

4. The system of claim 1 wherein the width of the optically reflective and transmissive sections is about one half the pitch of the sections.

5. The system of claim 1 wherein the periodic interleaver comprises a plate having substantially parallel surfaces which are disposed at an angle of about 45 degrees with respect to the first and second outputs of the respective first and second laser emitter bars.

6. The system of claim 5 wherein the first output is laterally displaced by refraction through the thickness of the plate.

7. The system of claim 1 wherein the periodic interleaver comprises a pair of prisms wherein the periodic interleaver is formed on a surface of at least one of the prisms.

* * * * *